United States Patent
Wechsler et al.

(10) Patent No.: US 11,482,885 B2
(45) Date of Patent: Oct. 25, 2022

(54) STATIONARY PART FOR AN INDUCTIVE POWER TRANSFER PAD

(71) Applicant: Bombardier Primove GmbH, Berlin (DE)

(72) Inventors: Simon Wechsler, Esslingen (DE); Roman Gunt, Heidelberg (DE)

(73) Assignee: Bombardier Primove GmbH, Berlin (DE)

( * ) Notice: Subject to any disclaimer, the term of this patent is extended or adjusted under 35 U.S.C. 154(b) by 0 days.

(21) Appl. No.: 17/287,265

(22) PCT Filed: Oct. 22, 2019

(86) PCT No.: PCT/EP2019/078686
§ 371 (c)(1),
(2) Date: Apr. 21, 2021

(87) PCT Pub. No.: WO2020/083888
PCT Pub. Date: Apr. 30, 2020

(65) Prior Publication Data
US 2021/0359547 A1    Nov. 18, 2021

(30) Foreign Application Priority Data

Oct. 23, 2018   (GB) ..................................... 1817240

(51) Int. Cl.
*H01F 27/42*    (2006.01)
*H01F 37/00*    (2006.01)
(Continued)

(52) U.S. Cl.
CPC .............. *H02J 50/10* (2016.02); *B60L 53/12* (2019.02); *H05K 7/20909* (2013.01)

(58) Field of Classification Search
CPC ........ H02J 50/10; B60L 53/12; B60L 53/302; H05K 7/20909
See application file for complete search history.

(56) References Cited

U.S. PATENT DOCUMENTS 7,907,041 B2   3/2011  Hahn et al.
9,566,870 B2   2/2017  Amma et al.
(Continued)

FOREIGN PATENT DOCUMENTS

FR    2732169 A1 *  9/1996  ............ B60L 11/182
FR    2732169 A1     9/1996
WO    2015128450 A1  9/2015

OTHER PUBLICATIONS

International Search Report and Written Opinion dated Dec. 16, 2019, in connection with PT/EP2019/078686 filed Oct. 22, 2019.

*Primary Examiner* — Daniel Cavallari
*Assistant Examiner* — Rasem Mourad
(74) *Attorney, Agent, or Firm* — Downs Rachlin Martin PLLC

(57) ABSTRACT

A stationary part for an inductive power transfer pad that, in an embodiment, comprises: an electronic section including an electronic housing; a receiving section for a movable part of the inductive power transfer pad; a cooling channel predominantly or solely running through the receiving section and having a first end and a second end both being connected to an interior of the electronic housing; a first fan placed within the cooling channel or at the first or second end, or beneath the first or second end of the cooling channel, wherein, when the fan is operating, air from the interior of the electronic housing can be transported through the cooling channel, heat can be transferred from the air to a structural member of the receiving section so that the air cools down, and cooled-down air can be transported back to the interior of the housing.

20 Claims, 11 Drawing Sheets

Figure 1:
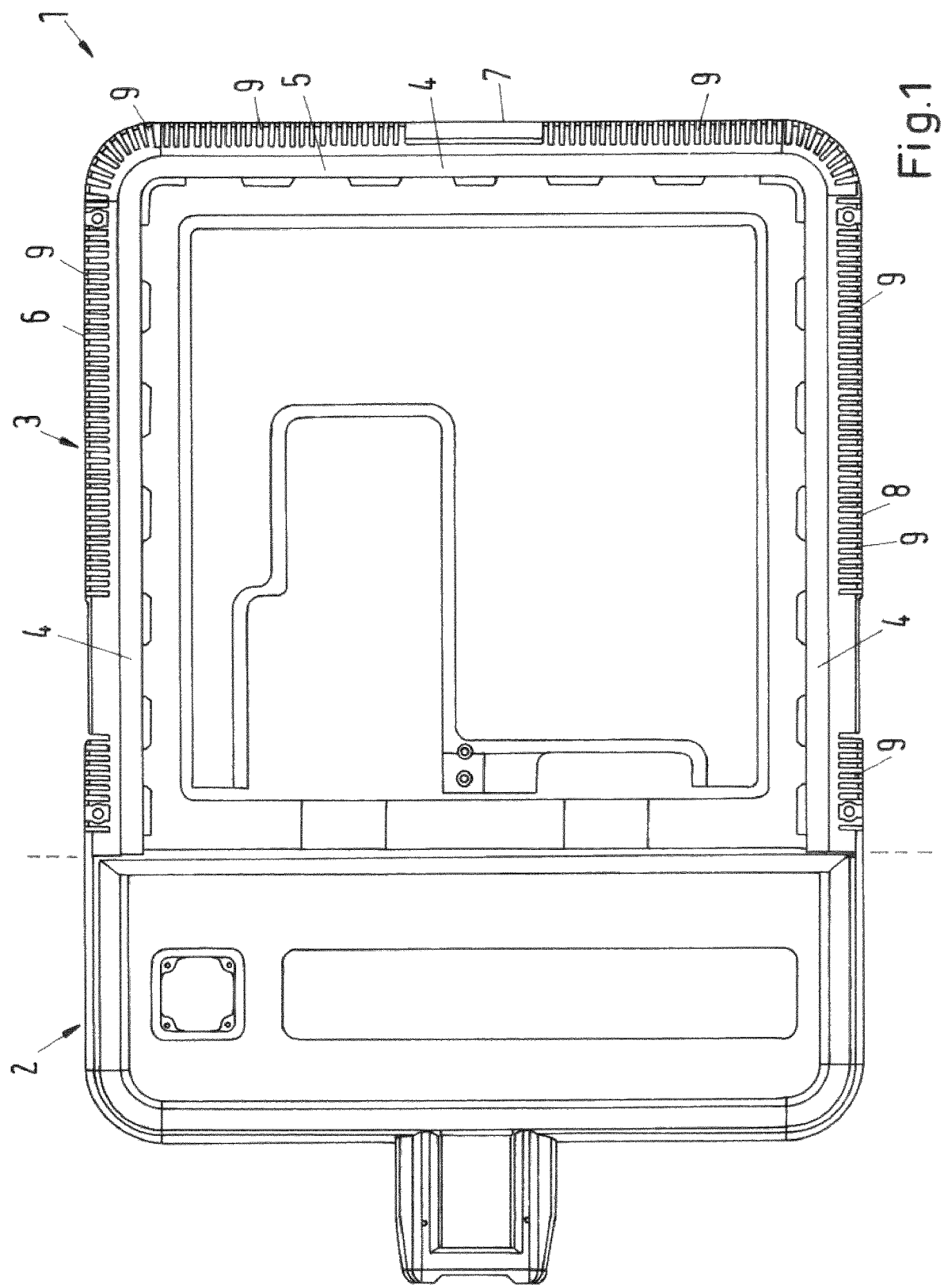

(51) Int. Cl.
  *H01F 38/00*  (2006.01)
  *H02J 50/10*  (2016.01)
  *B60L 53/12*  (2019.01)
  *H05K 7/20*   (2006.01)

(56) References Cited

U.S. PATENT DOCUMENTS

| | | |
|---|---|---|
| 10,412,863 B2 | 9/2019 | Elias et al. |
| 10,800,272 B2 | 10/2020 | Baumer et al. |
| 2012/0203410 A1* | 8/2012 | Wechlin ................ B60L 53/126 361/679.01 |
| 2017/0080815 A1* | 3/2017 | Wechsler .............. B60L 53/305 |
| 2017/0088005 A1* | 3/2017 | Christen ................ B60L 53/14 |
| 2018/0160572 A1* | 6/2018 | Elias ....................... B60L 53/12 |
| 2018/0251035 A1 | 9/2018 | Baumer et al. |
| 2019/0306931 A1* | 10/2019 | Malkomes ........... H05B 6/1263 |
| 2020/0021125 A1* | 1/2020 | Thiel ....................... B60R 11/02 |
| 2021/0197686 A1* | 7/2021 | Ozaki .................... H02J 50/90 |

* cited by examiner

STATIONARY PART FOR AN INDUCTIVE POWER TRANSFER PAD

The present invention relates to a stationary part for an inductive power transfer pad, and a method for heat dissipation out of an electronic section of a stationary part of an inductive power transfer pad.

Electric vehicles, in particular a track-bound vehicle, and/or a road automobile, can be operated by electric energy which is transferred by means of an inductive power transfer. Such a vehicle may comprise a circuit arrangement, which can be a traction system or a part of a traction system of the vehicle, comprising a receiving device adapted to receive an alternating electromagnetic field and to produce an alternating electric current by electromagnetic induction. Furthermore, such a vehicle can comprise a rectifier adapted to convert an alternating current (AC) to a direct current (DC). The DC can be used to charge a traction battery or to operate an electric machine. In the latter case, the DC can be converted into an AC by means of an inverter.

The inductive power transfer is performed using two sets of e.g. three-phase windings. A first set is installed on the ground (primary windings or primary winding structure) and can be fed by a wayside power converter (WPC). The second set of windings (secondary winding structure) is installed on the vehicle. For example, the second set of windings can be attached underneath the vehicle, in the case of trams under some of its wagons. For an automobile it can be attached to the vehicle chassis. The second set of windings or, generally, the secondary side is often referred to as pick-up-arrangement or receiver. The first set of windings and the second set of windings form a high frequency transformer to transfer electric energy to the vehicle. This can be done in a static state (when there is no movement of the vehicle) and in a dynamic state (when the vehicle moves).

In particular in the case of road automobiles, a stationary primary unit comprises a plurality of elements which are often arranged spatially separated.

For inductive power transfer, inductive power transfer pads comprising a stationary part and a movable part are known from the state of the art. WO 2015128450 A1 discloses an inductive power transfer pad comprising a stationary part and a movable part, wherein the movable part comprises a primary winding structure, wherein the movable part is movable between a retracted state and an extended state.

The stationary part of such power pads usually comprises an electronic housing wherein electronic components are located, such as MOSFETs. These electronic components create heat that has to be removed from the electronic parts and the electronic housing in order to avoid damage of components.

The objective of the present invention is to provide with a stationary part for an inductive power transfer pad, wherein heat from electronic components can be effectively removed from these components and dissipated.

According to a basic idea of the invention, warmed-up air from an electronic housing within a stationary part is transported in a channel that runs through a further part or section of the stationary part and is transferred to said further part or section. Thereby, heat, formerly concentrated in the electronic housing, is distributed over larger regions of the stationary part. Subsequently, the heat can be dissipated, at least partially, to the environment. The air that was removed from the electronic housing can be, after cooling down, returned to the electronic housing. So, the present invention also describes a cyclic cooling system, based on convection of air within the stationary part of an inductive power transfer pad.

Particularly the invention provides with a stationary part for an inductive power transfer pad according to claim 1, as well as an inductive power transfer pad, and a method for heat dissipation out of an electronic section of a stationary part of an inductive power transfer pad according to further independent claims, as attached. Further advantageous embodiments are provided by the subject-matter with the features of the dependent claims.

The invention provides with a stationary part for an inductive power transfer pad, comprising
- an electronic section, comprising an electronic housing,
- a receiving section for a movable part of the inductive power transfer pad,
- a cooling channel, predominantly or solely running through the receiving section, and having a first end and a second end, the first end and the second end both being connected to an interior of the electronic housing,
- a first fan, which is placed
  i) within the cooling channel or
  ii) at, or beneath the first or second end of the cooling channel, or
  iii) within the interior of the electronic housing, wherein the electronic housing is divided by a wall into two compartments and the first fan is placed in such manner that air is transported from one of the compartments into the other compartment when the first fan is in operation,
- wherein, when the fan is in operation, air from the interior of the electronic housing can be transported through the cooling channel, heat can be transferred from the air to a structural member of the receiving section, so that the air cools down, and cooled-down air can be transported back to the interior of the housing.

The length of the cooling channel (hereinafter also just called "a channel") can be chosen as long as possible in order to reach a heat transfer as high as possible, thereby having in mind constructional conditions and limitations. It is beneficial if as much as possible of the channel length runs through the receiving section. First, most parts of the receiving section are distant to the electronic section. Moreover, the receiving section is larger than the electronic section.

In one embodiment of the invention, the cooling channel runs, with a part that runs through the receiving section, along an outer edge of the receiving section. Thereby, a high channel length can be reached. Moreover, a location beneath the edge improves heat dissipation. And the channel also does not collide with other components within the receiving section.

In above mentioned case iii) the first fan is placed within the interior of the electronic housing, and the electronic housing is divided by a wall into two compartments and the first fan is placed in such manner that air is transported from one of the compartments into the other compartment when the first fan is in operation. The first fan may be placed adjacent to the wall, which is a separating wall. The wall may have an opening and the first fan be connected to the opening, either with an inlet-side of the fan or an outlet side. The first fan may predominantly or solely by placed into one of the compartments. Air from one compartment is transported by the first fan into the other compartment. A pressure difference is obtained between the two compartments when the fan is in operation. So, one of the compartments, which is a compartment on the inlet side, is a low pressure compartment, and the other compartment, which is on the outlet-side of the fan, is a pressure compartment. From the pressure compartment, air is transported in the cooling channel and after flowing through the cooling channel, air flows into the low pressure compartment.

The following embodiment can be beneficially be applied when according to ii) the first fan is placed at, or beneath the first or second end of the cooling channel, but is not limited on that. The stationary part may comprise a second fan which may be placed within the cooling channel or at the first end (particularly if a first fan is placed at the second end) or second end (particularly if a first fan is placed at the first end) of the cooling channel, or beneath the first end (particularly if a first fan is placed beneath the second end) or second end (particularly if a first fan is placed beneath the first end).

An inlet side of the first fan can be oriented towards the interior of the electronic housing, and the pressure side of the second fan can be oriented towards the interior of the electronic housing, or vice versa. Choosing or setting the inlet side and the pressure side may be done by the operational mode of a fan, i.e. by choosing the direction of rotation of a fan wheel. Or a fan whose inlet side and the pressure side are fixed may be brought in the right orientation. This embodiment provides with an even more effective means for transporting air through the cooling channel over large distance, preferably without or with minimized decrease of flow speed.

In one embodiment, the cooling channel comprises a first compressure section adjacent to the first fan, if the first fan is placed at, or beneath one end of the cooling channel and/or a second compressure section adjacent to the second fan, if the second fan is present and if the second fan is placed beneath the other end of the cooling channel. By one or more compressure sections laminar flow of air within the cooling channel can be created or improved. A compressure section may be designed as a separate part which may be connected with another part of the channel.

In a further embodiment, the cooling channel comprises cooling fins in the interior of the cooling channel which are oriented parallel to the extension of the cooling channel. These allow an even more effective cooling.

In a further embodiment, the cooling channel comprises at the first and/or the second end, a channel-section with cooling fins, wherein said section is located in the electronic section and is in contact with a wall of the electronic section. Cooling fins in this section may be relatively dense in order to provide with an efficient heat transfer.

In still a further embodiment, the electronic section comprises cooling fins on the outer side, adjacent to the cooling channel. These cooling fins are preferably located adjacent at a wall which is in contact with a channel-section of the cooling channel which is located in the electronic section.

In a further embodiment, the receiving section comprises cooling fins on the outer side, adjacent to the cooling channel.

In one embodiment a part of the cooling channel that runs through the receiving section is integrally formed within the structural member of the receiving section. For example, the receiving section may be cast metal, preferably cast aluminium. The cooling channel may be integrally formed as a whole or in part. When formed as a whole, the whole side wall, or all side walls, of a channel is/are formed, so that a closed structure is formed. Casting techniques may be used which are known to the skilled person, if the receiving section may is a cast metal. When formed I part, one side of the channel within a receiving section, for example within a structural member of the receiving section, is still open. I.e. a side wall or part of a side wall in missing. The channel may be closed by one or more further parts, for example a cover or covering part, such as a plate or a sheet.

In one embodiment, a part of the cooling channel that runs through the electronic section is integrally formed, as a whole or a part, within a structural member of the electronic section. The same principles can apply as mentioned before with respect to forming a channel integrally within a receiving section.

The present invention is, in a further aspect, directed to a inductive power transfer pad, in particular a transfer pad of a system for inductive power transfer to a vehicle, comprising a stationary part as described herein and a movable part. The movable part may comprise a winding structure for generating a magnetic or electromagnetic field when an electric current flows though windings of the winding structure. The movable part may be moved in Z direction, i.e. upwards and downwards by an actuator, as a further part of the power transfer pad.

In a further aspect, the invention is directed to a method for heat dissipation out of an electronic section of a stationary part of an inductive power transfer pad, the method comprising:

providing with a stationary part or an inductive power transfer pad as described herein, operating the fan within the stationary part, so that air from the interior of the electronic housing is transported through the cooling channel, heat is transferred from the air from the electronic housing to the structural member of the receiving section, so that the air cools down, and cooled-down air is transported back to the interior of the housing, and heat is further dissipated from the structural member to the environment.

The previous disclosure discloses method-like features that could be used in the present method. The previous disclosure also discloses structural features that could be used in the present method.

Figure 2:
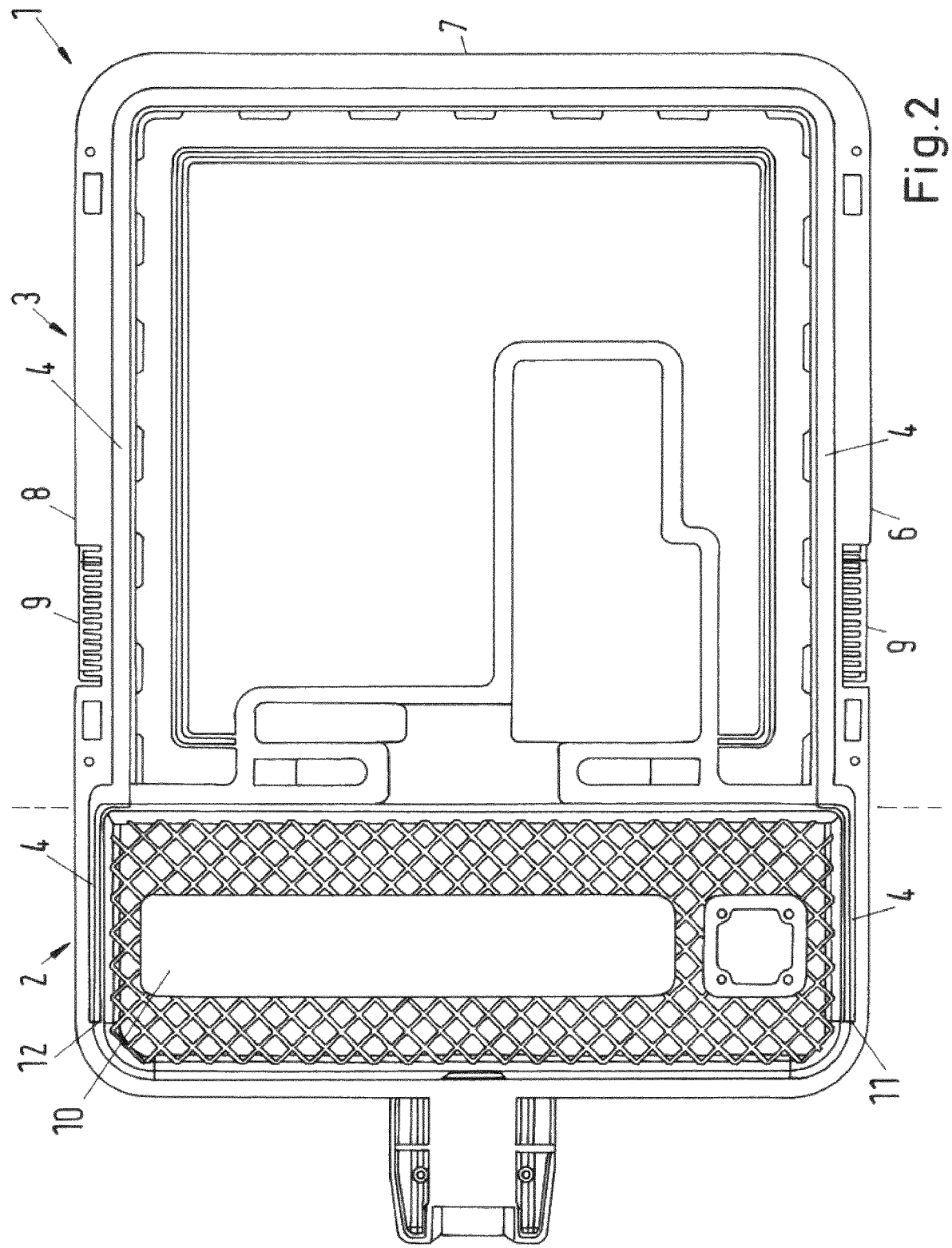
Figure 3:
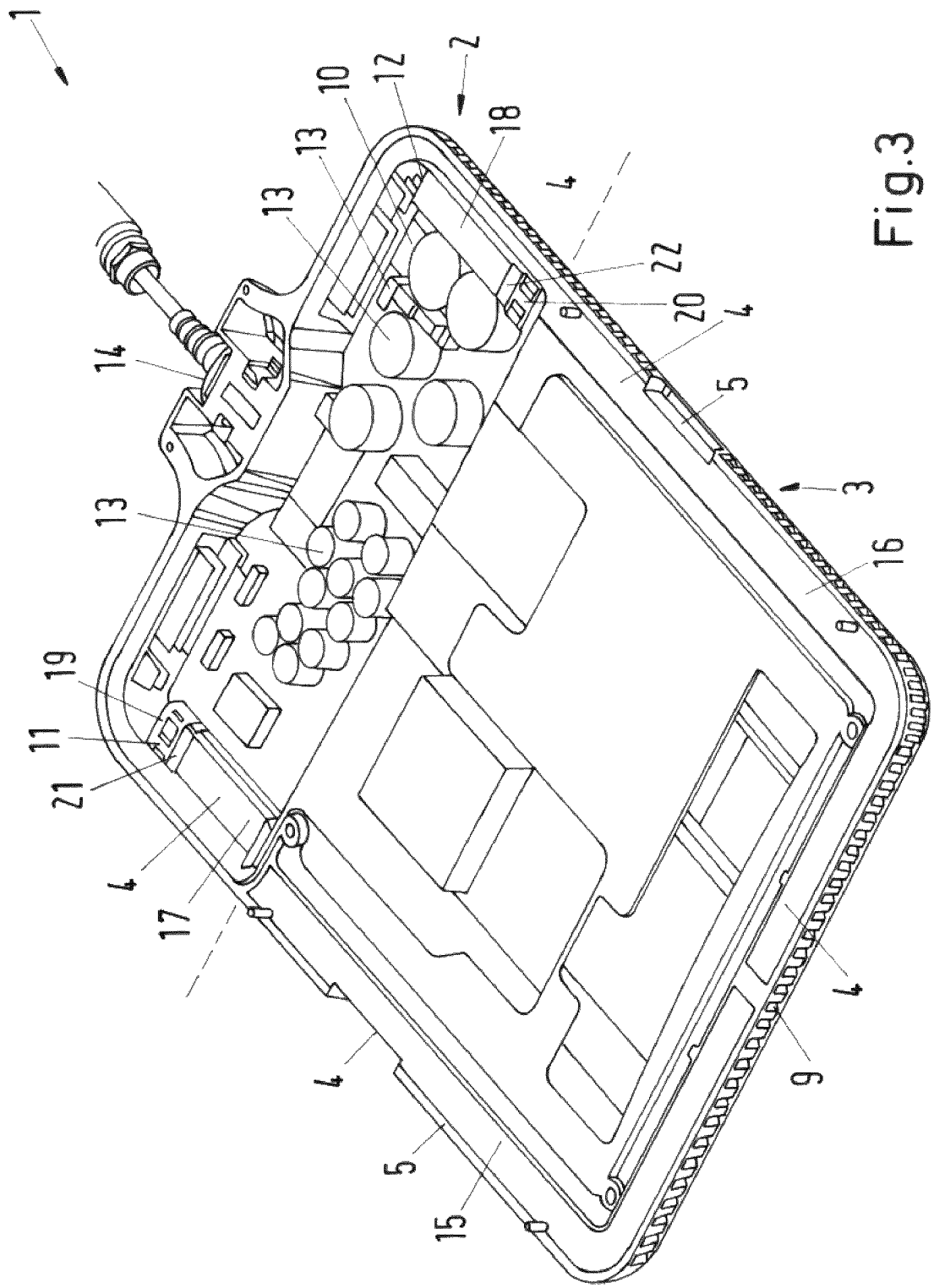
Figure 4:
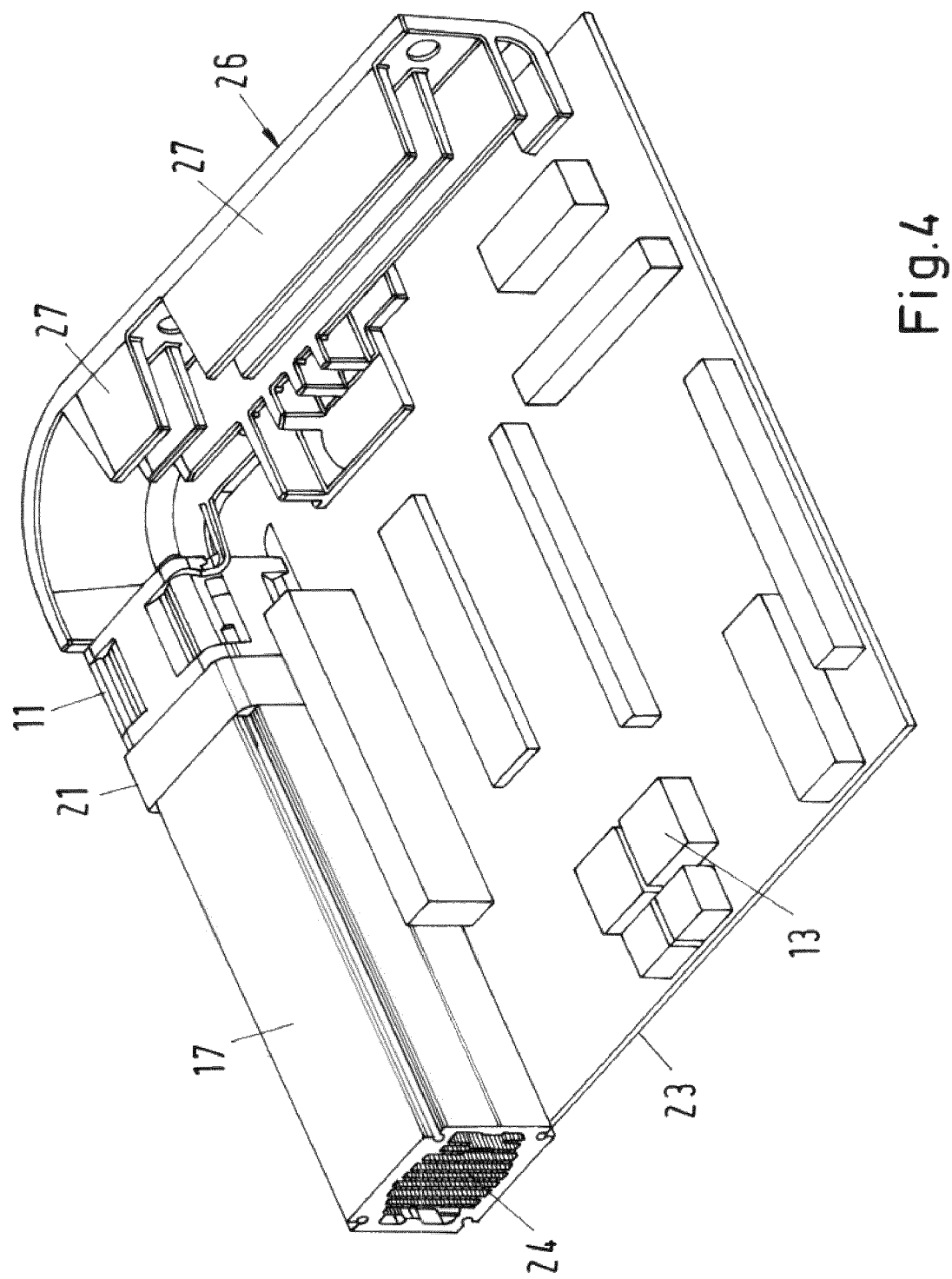
Figure 5:
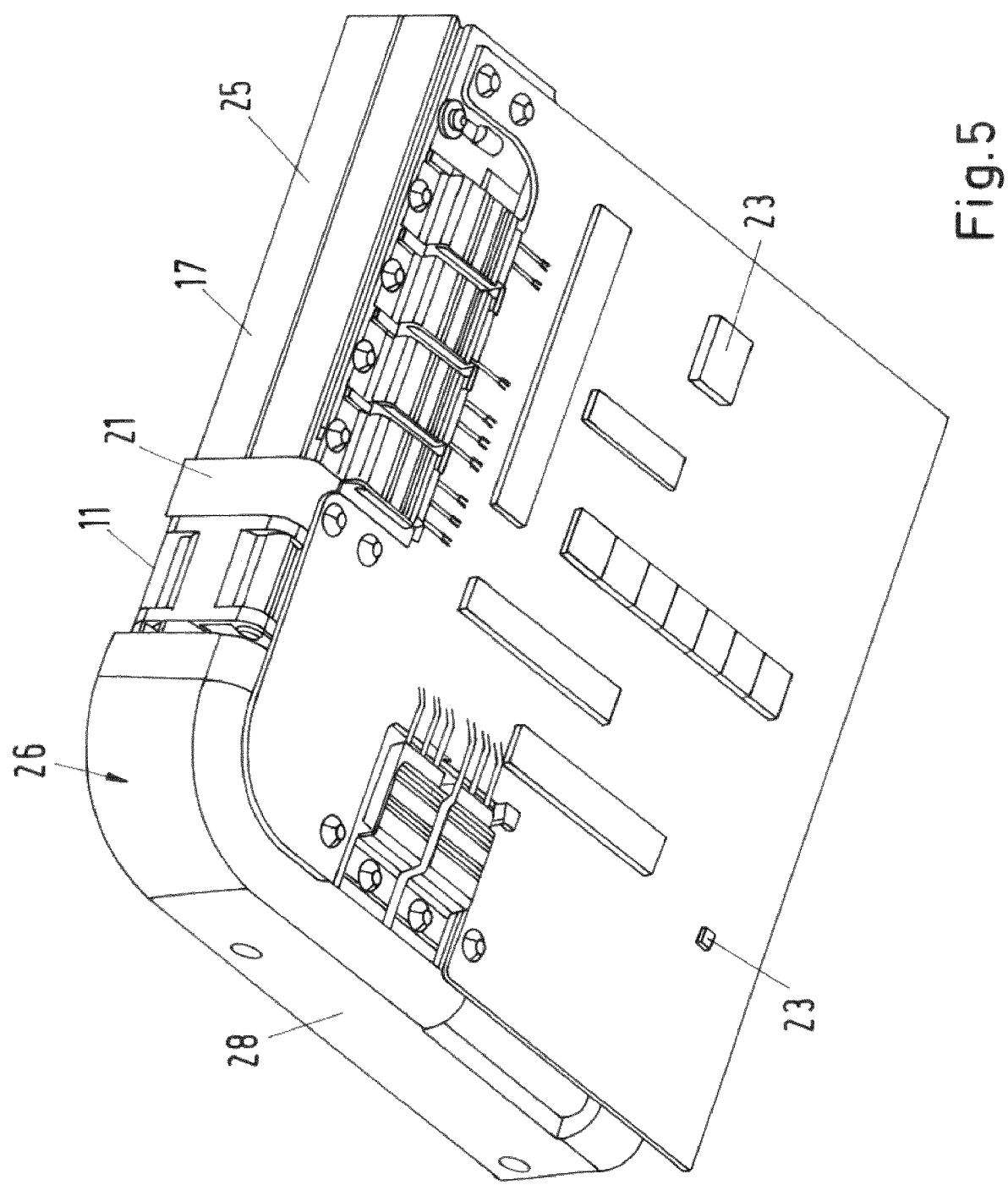
Figure 6:
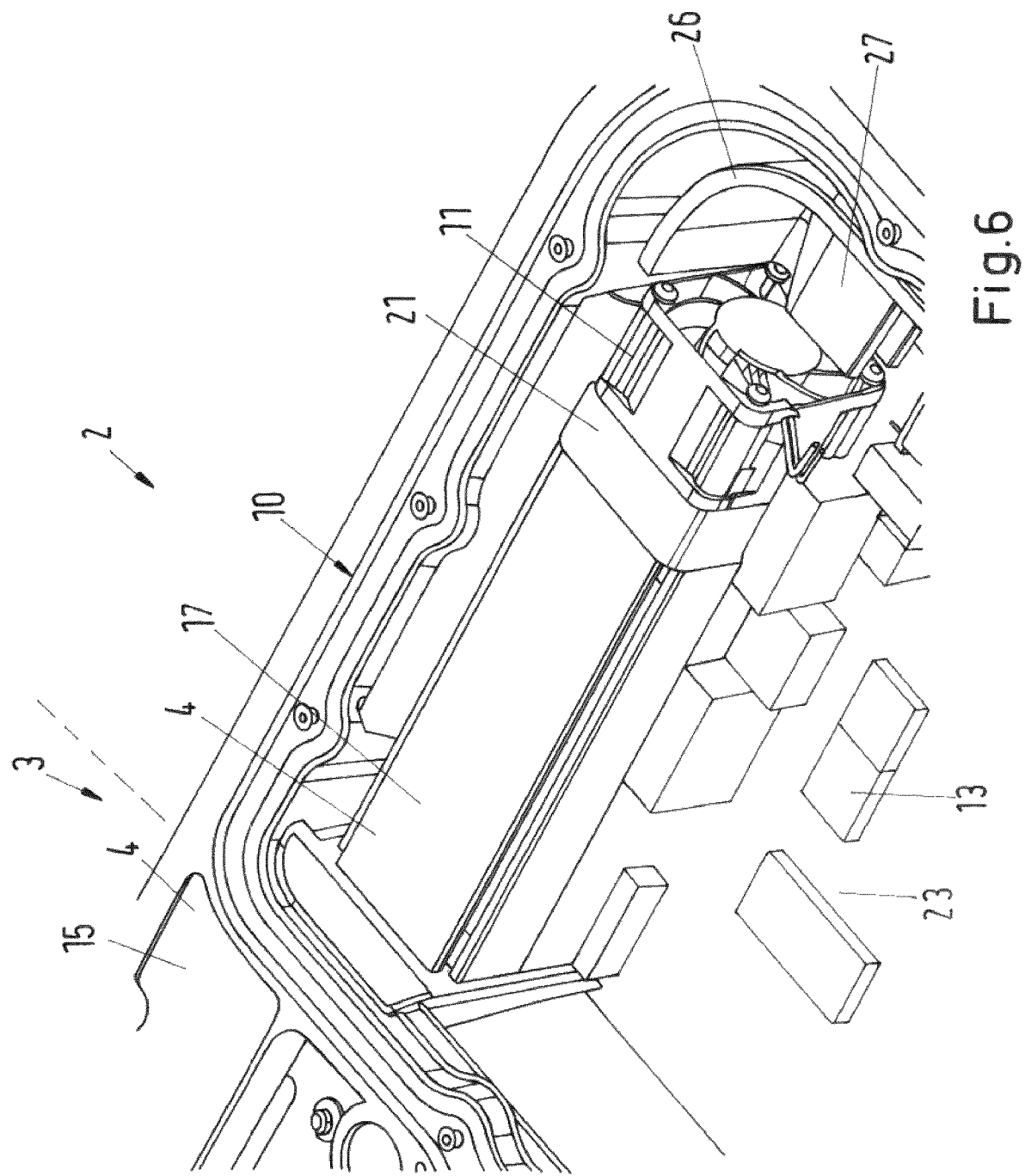
Figure 7:
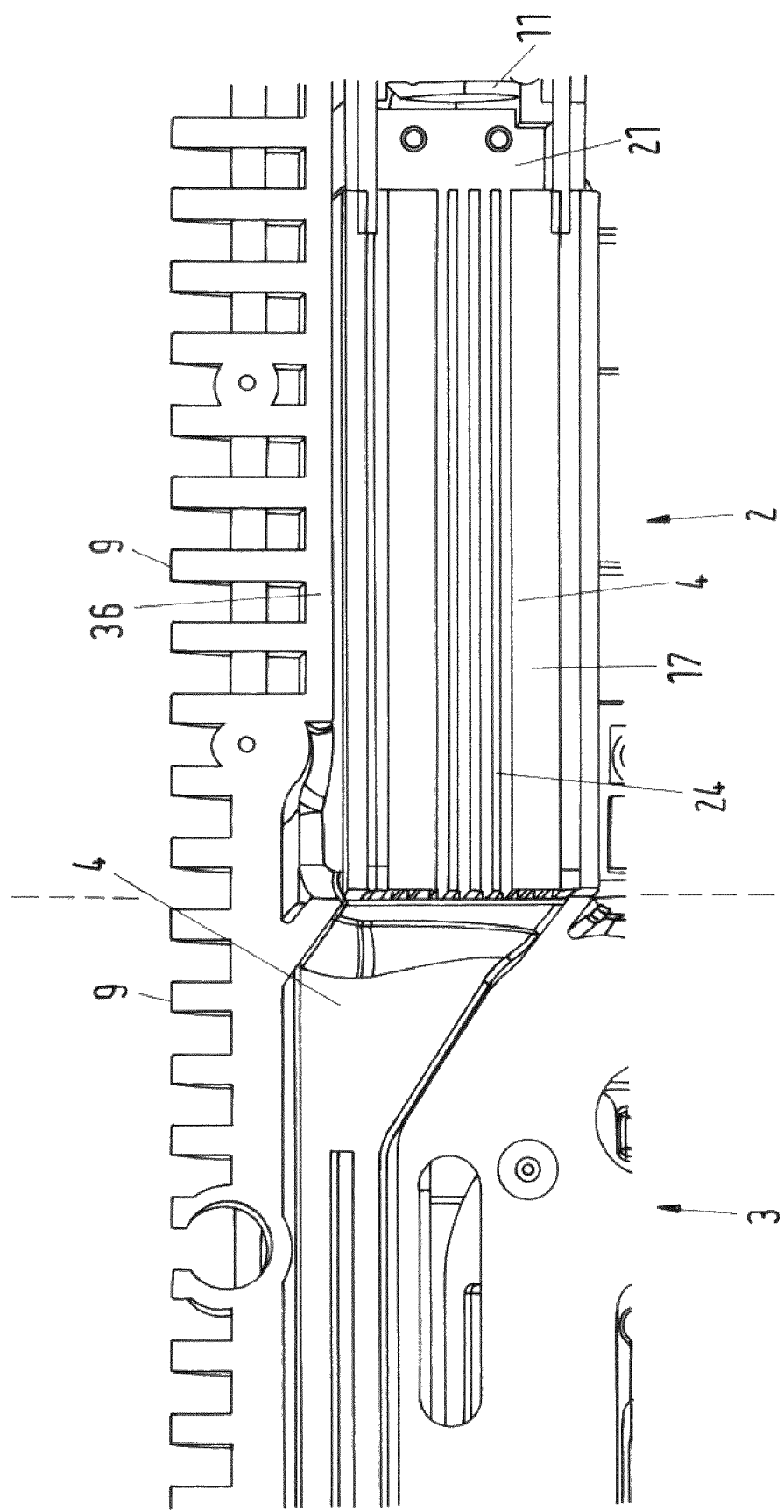
Figure 8A:
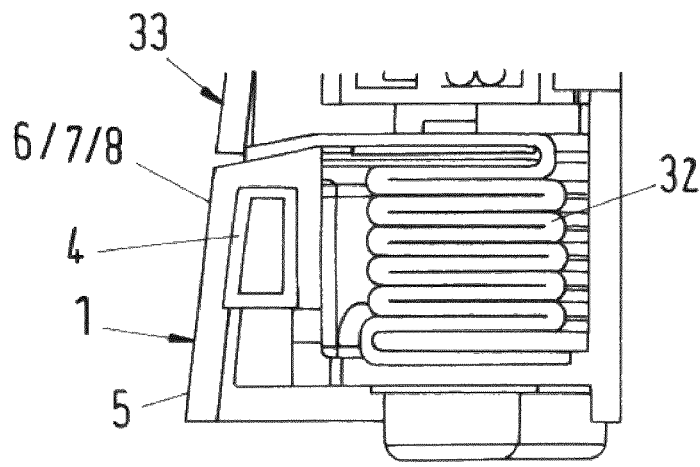
Figure 8B:
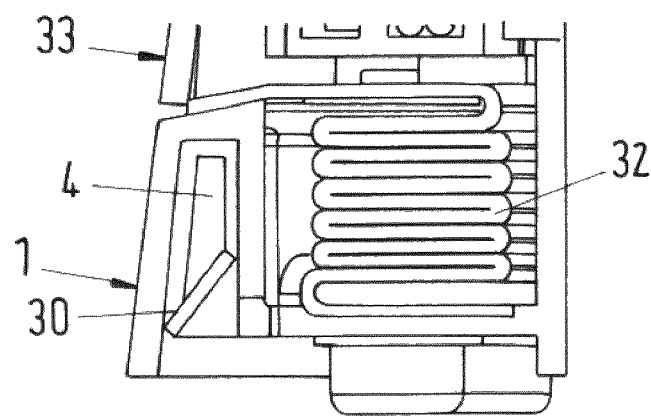
Figure 8C:
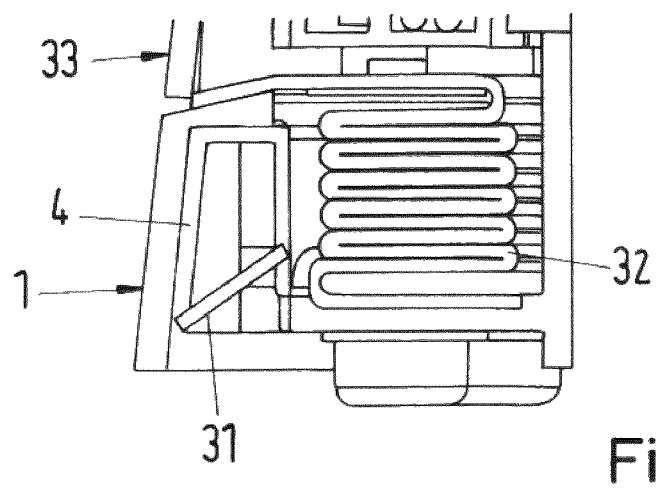
Figure 9:
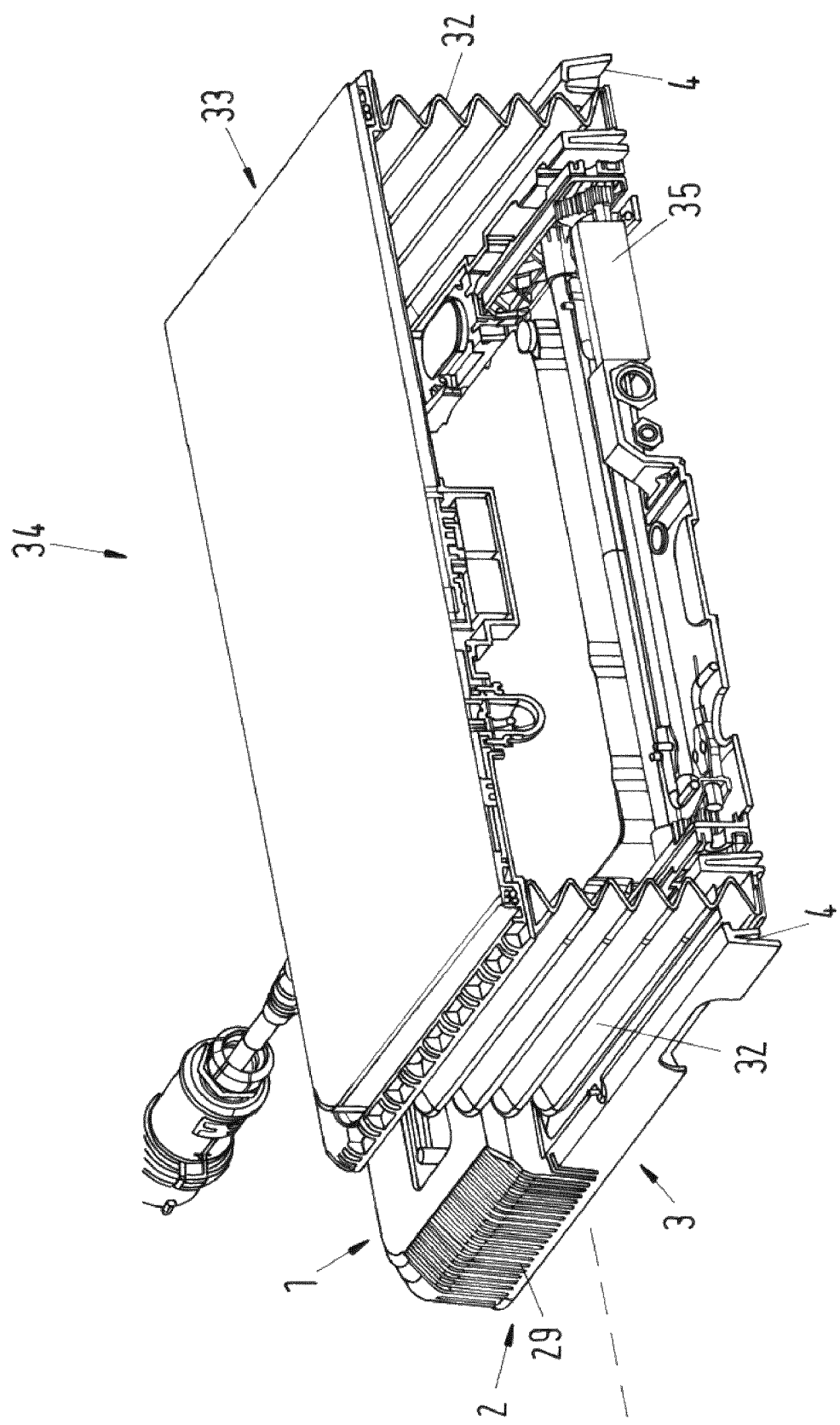
Figure 10:
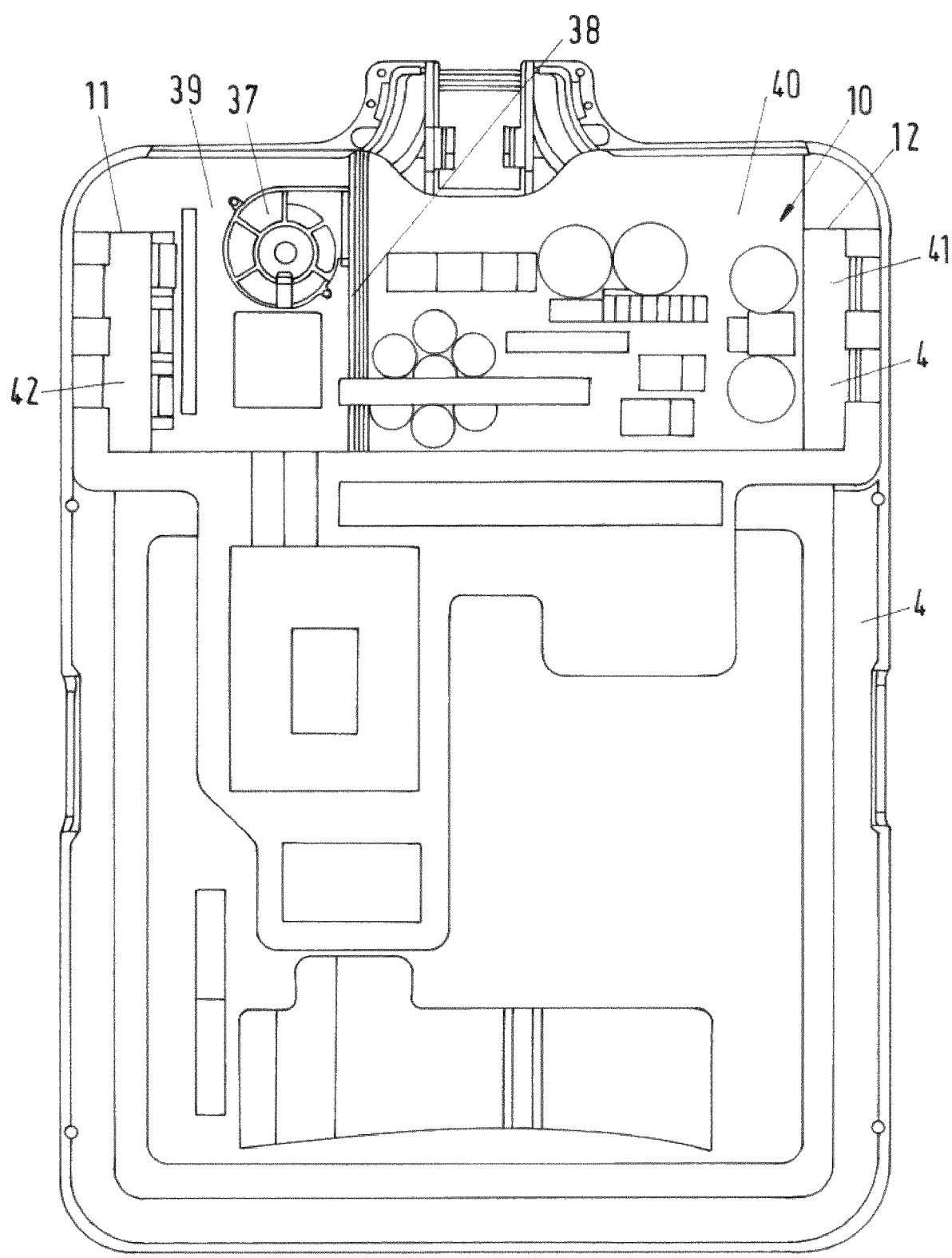
Figure 11:
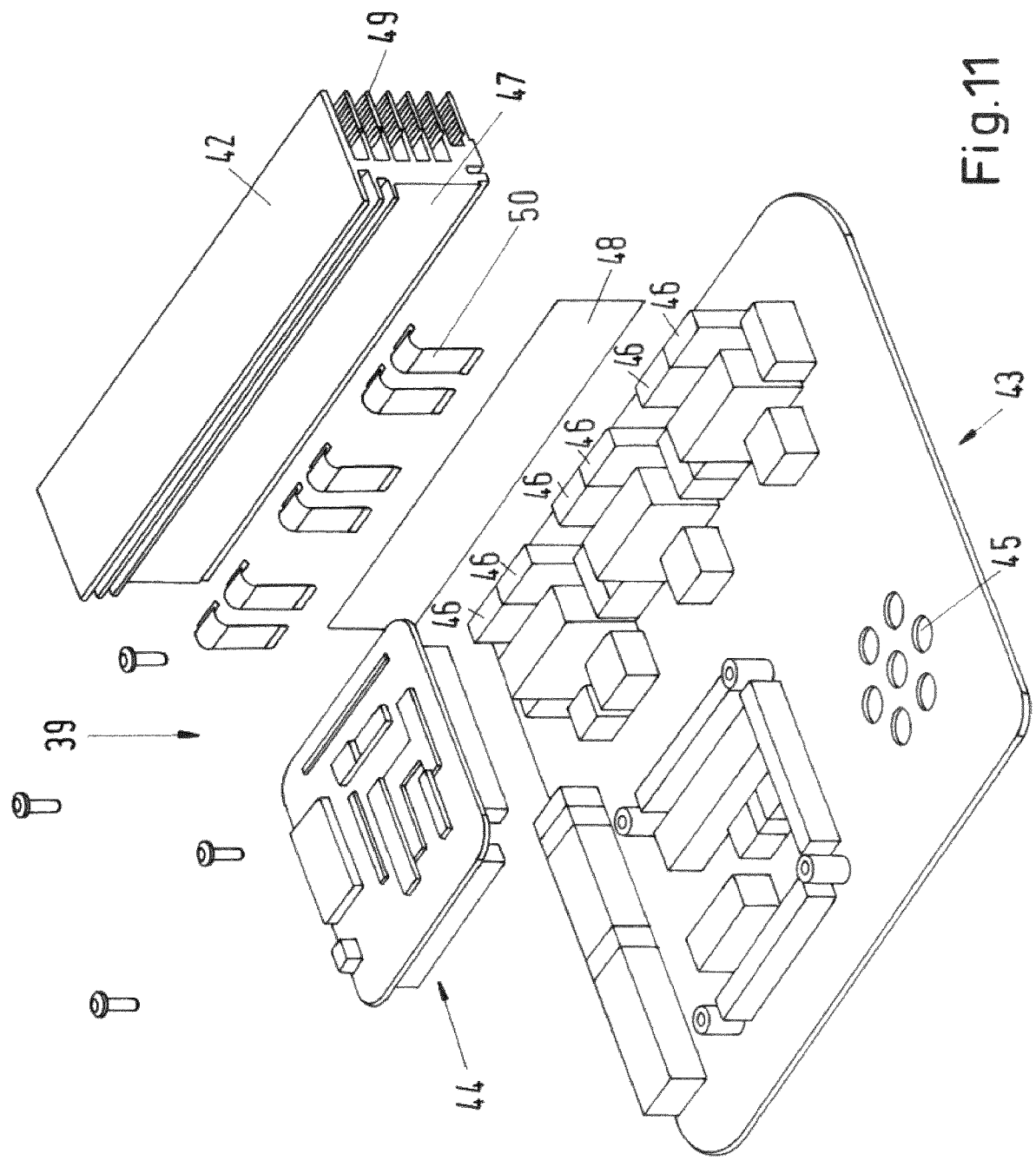

Hereinafter, the invention will be described in more detail but without limitation with reference to attached working examples and figures which show:

FIG. 1 a stationary part of the invention from a top view;

FIG. 2 a stationary part of the invention from a bottom view;

FIG. 3 a stationary part of the invention from a bottom, perspective view;

FIG. 4 a detail of an electronic section an electronic housing from a top, perspective view;

FIG. 5 a detail of an electronic section an electronic housing from a bottom, perspective view;

FIG. 6 a further detail of an electronic section an electronic housing from a bottom, perspective view;

FIG. 7 a cross section through a cooling channel in the transition from the electronic section to the receiving section;

FIG. 8a-8c cross sections through cooling channels with different dimensions;

FIG. 9 a power transfer pad comprising the stationary part;

FIG. 10 a further embodiment of the invention, comprising an electronic section divided into two compartments;

FIG. 11 a detail of the embodiment of FIG. 10.

FIG. 1 shows the stationary part 1, comprising the electronic section 2 and the receiving section 3. A dashed line shows the boundary between the electronic section 2 and the receiving section 3.

A cooling channel 4 is running through the receiving section 3. The receiving section 3 comprises the frame-like structure 5 with the edges 6, 7, 8. The frame-like structure 5 is a structural member 5 of the receiving section.

The edges 6, 7, 8 form an outer edge of the receiving section 3. Cooling fins 9 are placed along the edges 6, 7, 8 on the outer side of the receiving section, adjacent to the cooling channel 4. The cooling channel 4 runs through the interior of the frame-like structure 5 along the outer edges 6, 7, 8.

FIG. 2 shows the stationary part 1 from the bottom side, whereas FIG. 1 shows a top view. FIG. 2 shows an electronic housing 10 within the electronic section 2. The electronic housing 10 is a hollow part of the electric section 2 and can be covered from the bottom side by a cover which is not shown.

FIG. 2 shows that the cooling channel 4 also extends into the electronic section. A first end 11 and a second end 12 are shown which are connected to the interior of the electronic housing. In other words: The cooling channel 4 begins/ends in the electronic housing 10.

FIG. 2 moreover shows some cooling fins 9 which could only be seen from the bottom side.

FIG. 3 shows a perspective view on the bottom side of the stationary part 1. In contrast to the empty stationary part 1 which is shown in FIG. 1 and FIG. 2, electronic components 13 are placed in the housing 10, connected to a circuit board which is also placed in the housing 10 below the electronic components 13.

The receiving section 3 is also filled with components, such as an actuator for a movable part and electrical connections (not shown with reference signs).

A plug 14 is shown, which is connected to the electronic section 2.

The part of the cooling channel 4 which runs through the receiving section 3 is covered by two cover plates 15, 16. The reference signs 4 in the receiving section 3 just intended to show that the cooling channel 4 is running below the cover plates 15, 16 in this perspective.

In the electronic section 2, two channel sections 17, 18, which are part of the cooling channel 4, are located. The channel sections 17, 18 are end-sections which are not integrally formed within the electronic section 2 and which are instead separate parts that are fixed in the housing 10 and which are connected to the cooling channel section which runs through the receiving section 3. An air tight sealing, for example a foam sealing, is placed between the channel sections 17, 18 and the cooling channel section of the channel 4 which runs through the receiving section 3. A further sealing may be placed laterally between each of the channel sections 17, 18 and the housing. The channel sections 17, 18 serve as cooling elements, in comparison to the part of the channel 4 which runs through the receiving section. Sections 17, 18 are separate elements which are distinct from the other part of the channel 4 which runs through the receiving section. The part of the channel 4 in the receiving section may be a casted part. Since air is also guided through sections 17 and 18, they are considered as parts of the channel 4. The sections 17, 18 comprise fins 24 inside. FIG. 4 shows a section 17 in detail.

A first fan 19 is placed at the first end 11 of the cooling channel 4. Adjacent to the first fan 19, a compressure section 21 is placed. The compressure section 21 causes compression of air that is transported through the first fan 19 into the cooling channel 4. Moreover, the compressure section causes a laminar flow of the air.

A second fan 20 is placed before the channel section 18. Adjacent to the second fan 20, a further compressure section 22 is placed.

The first fan 19 can be operated in such a way that it sucks air from the interior of the housing 10, which is warmed up air, warmed up by the electronic components 13. The air is then transported through the channel section 17, which is already formed as a heat exchanger which transfers heat to the electronic housing 10, i. e. the walls of the electronic housing 10 and the exterior. Then the air is transported through the U-shaped section of the cooling channel 4 which runs through the receiving section 3. The second fan 20 is operated in a way that it sucks air from the interior of the section of the cooling channel 4 which runs through the receiving section 3. Air is transported from the second fan 20 into the channel section 18 and blown out through the second end 12 of the cooling channel 4. So, the air is transported back into the housing 10. On its way through the whole channel 4, heat is mainly transferred to the frame-like structure 5 with the cooling fins 9 and then dissipated to the exterior.

FIG. 4 shows a more detailed view on a cut out of FIG. 3 from the top side and FIG. 5 shows a view on the same section from the bottom side. Both Figs. show a circuit board 23 with the electronic components 13. Both Figs. show the first fan 11, the compressure section 21 and the channel section 17 within the electronic housing 10. The channel section 17 comprises air guide fins 24 in the interior in order to provide with an efficient guidance of air in the channel. Heat is transferred from the air to the lateral surface 25 of the channel section 17 (shown in FIG. 5) and from the lateral surface 25 to the electronic housing 10, i. e. to the wall of the electronic housing 10 which is adjacent to the channel section 17.

FIG. 4 and FIG. 5 moreover show a heat dissipation means 26 having cooling ribs 27 that are oriented towards the interior of the electronic housing 10. Heat from the inside of the electronic housing 10 is transported via the cooling ribs 27 to the lateral surface 28 of the heat dissipation means 26. From the lateral surface 28 heat can be transferred to a wall of the electronic housing 10 which is in touch with the lateral surface 28. A further function of cooling ribs 27 is to lead air to the fan at the inlet of the cooling channel.

FIG. 6 shows how the parts shown in FIG. 4 and FIG. 5 are placed inside the electronic housing 10. FIG. 6 moreover shows the connection of the channel section 17 to the receiving section 3.

FIG. 7 shows a cross-section through the channel section 17 of the cooling channel 4 to the part of the cooling channel 4 that runs through the receiving section 3. It can be seen, that the part of the cooling channel 4 that runs through the receiving section 3 is integrally formed within the receiving section. Moreover, cooling fins 9 on the outer side of the electronic housing 10 are shown. FIG. 7 moreover shows a wall 36 of the electronic section which is in contact with the channel section 17.

FIGS. 8a, 8b and 8c show different types of cooling channels 4 running through the receiving section 3. In FIG. 8a, the cooling channel 4 is a closed channel within a cast-structure of the structural member 5. In FIG. 8b and FIG. 8c, the channel 4 is not closed from the bottom side in closure from the bottom side is done by a plate or cap 30, 31, such as the cover plates 15, 16 in FIG. 3. Cover plates 30, 31 are diagonally placed at the bottom side of the channel 4 in order to reach a larger channel-cross section. In FIG. 8c, the channel 4 is wider than the channel 4 in FIG. 8b. Adjacent to the channel 4 and adjacent to the outer edge 6, 7 or 8, the bellow 32 is shown which closes the interior of the inductive power transfer pad when a movable part of the power transfer pad is moved upwards. FIGS. 8a, 8b and 8c moreover show the movable part 33 which is in its resting position placed on the stationary part 1.

FIG. 9 shows a whole power transfer pad 34 in a cross-section, comprising the stationary part 1 and the movable part 33. The power transfer pad 34 comprises the actuator 35, located at the stationary part 1 for moving the movable part 33 up and down. In FIG. 9, the movable part 33 is moved upwards.

FIG. 10 shows a further embodiment (compare with the embodiment of FIG. 3) wherein a first fan 37, which is a radial fan, is placed within the interior of the electronic housing 10. The electronic housing 10 is divided by a wall 38, which is a separating wall, into two compartments, a first compartment 39 on the inlet side of the fan 37 and a second compartment 40 on the outlet side of fan 37. The radial fan 37 is placed in the first compartment 39 and its outlet is connected to an opening in the wall 38. The fan 37 when in operation transports air from compartment 39 into compartment 40, thereby increasing the pressure in compartment 40. The air takes up heat from components in compartment 40 and is pressed through the second end 12 of the cooling channel 4 into a channel section 41, having air guide fins (cf. FIG. 11), and through the section 41 into the further part of the cooling channel 4.

The channel sections 41, 42 are in their function similar to channel sections 17, 18 in FIG. 3 and serve as cooling elements, in comparison to the other parts of the channel 4 within the receiving section 3. The constructional details may be the same or similar as explained above for the sections 17, 18.

The air flows through the cooling channel 4 and leaves it at channel section 42 with cooling ribs and flows through the first end 11 into the compartment 39, which is a low pressure compartment. Then, the air flows again through the inlet of the fan 37 and is transported again into the second compartment 40.

FIG. 11 shows a more detailed view on channel section 42 and electronic parts 43 and board 44 with further electronic parts which are placed in the second compartment 39. Then fan 37 is not shown here and will be fixed at mounting holes 45.

The channel section 42 has air guide fins 49 which are in contact with an outer wall of the compartment when the channel section is correctly positioned, so that a closed channel section is formed. Appropriate sealing may be provided between section 42 and the wall. Then, a closed channel section is formed. Even in embodiments when the channel section 42 is not closed in such manner, it is nevertheless called a "channel section" because air is flowing along the air guide fins 43 in longitudinal direction of the part 42.

Semiconductors 46 are shown which dissipate heat. The semiconductors 46 are on one side in touch with the lateral wall 47 of the channel section 42. A plate 48 is pressed with clamps 50 on the other side of the semiconductors 46 in order to bring the semiconductors 46 in touch with the lateral wall 47. The plate 48 isolates electrically and has heat conducting properties.

LIST OF REFERENCE SIGNS 1 stationary part
2 electronic section
3 receiving section
4 cooling channel
5 frame-like structure
6 edge
7 edge
8 edge
9 cooling fins
10 electronic housing
11 first end
12 second end
13 electronic components
14 plug
15 cover plate
16 cover plate
17 channel section
18 channel section
19 first fan
20 second fan
21 compressure section
22 further compressure section
23 circuit board
24 air guide fins
25 lateral surface
26 dissipation means
27 cooling ribs
28 lateral surface
30 cover plate
31 cover plate
32 bellow
33 movable part
34 transfer pad
35 actuator
36 wall
37 first fan
38 wall
39 first compartment of electronic housing
40 second compartment of electronic housing
41 channel section
42 channel section
43 electronic parts
4 board
45 mounting holes
46 semiconductors
47 lateral wall of channel section
48 plate
49 air guide fins
50 clamp

The invention claimed is:

1. A stationary part for an inductive power transfer pad comprising a movable part that includes a winding structure for generating an electromagnetic field, the movable part movable between an extended position and a retracted position during use of the inductive power transfer pad, the stationary part comprising:
   an electronic section comprising an electronic housing having an interior,
   a receiving section with at least one component that, when the movable part is installed, supports movement of the movable part between the retracted position and the extended position during use, the receiving section has a structural member,
   a cooling channel predominantly or solely running through the receiving section, wherein the cooling channel within the receiving section has a transverse cross-sectional shape that defines an elongated air passageway within the receiving section that is distinct from remaining portions of the receiving section and, the cooling channel having a first passageway, the first end and the second end both being connected to the interior of the electronic housing, wherein the air passageway forms a portion of a loop within the receiving section between the first and second ends of the cooling channel, the loop including the cooling channel and the electronic housing, a first fan, which is placed either:
  i) within the cooling channel, or
  ii) at the first end, or beneath the first end of the cooling channel, or
  iii) within the interior of the electronic housing, wherein the electronic housing is divided by a wall into two compartments and the first fan is placed in such manner that air is transported from one of the compartments into the other compartment when the first fan is in operation, wherein, when the first fan is in operation, air from the interior of the electronic housing is transported through the cooling channel, heat is transferred from air to the structural member of the receiving section so that air cools down, and cooled-down air is transported back to the interior of the housing.

2. The stationary part according to claim 1, wherein the cooling channel runs, within the receiving section, along an outer edge of the receiving section.

3. The stationary part according to claim 1, comprising a second fan, which is placed within the cooling channel or at the second end, or beneath the second end of the cooling channel, wherein an inlet side of the first fan is oriented towards the interior of the electronic housing, and an outlet side of the second fan is oriented towards the interior of the electronic housing.

4. The stationary part according to claim 1, wherein the cooling channel comprises a first compressure section adjacent to the first fan, and/or a second compressure section adjacent to a second fan, if the second fan is present.

5. The stationary part according to claim 1, wherein the cooling channel comprises air guide fins in the interior of the cooling channel which are oriented parallel to the extension of the cooling channel.

6. The stationary part according to claim 1, wherein the cooling channel comprises at the first and/or the second end, a channel-section with air guide fins, wherein said section is located in the electronic section and is in contact with a wall of the electronic section.

7. The stationary part according to claim 1, wherein the receiving section has an outer side and comprises cooling fins on the outer side, adjacent to the cooling channel.

8. The stationary part according to claim 1, wherein a part of the cooling channel that runs through the receiving section is, as a whole or in part, integrally formed within the structural member of the receiving section.

9. The stationary part according to claim 1, wherein a part of the cooling channel that runs through the electronic section is integrally formed within a structural member of the electronic section.

10. An inductive power transfer pad of a system for inductive power transfer to a vehicle, the inductive power transfer pad comprising both the stationary part according to claim 1 and the movable part according to claim 1.

11. A method for heat dissipation out of an electronic section of a stationary part of an inductive power transfer pad, the method comprising:
  providing a stationary part according to claim 1;
  operating the first fan within the stationary part according to claim 1.

12. A method for heat dissipation out of an electronic section of a stationary part of an inductive power transfer pad, the method comprising:
  providing an inductive power transfer pad according to claim 10; and
  operating the first fan within the stationary part according to claim 1.

13. The stationary part according to claim 1, wherein the structural member comprises a frame-like structure, the cooling channel running through the frame-like structure.

14. The stationary part according to claim 13, wherein the frame-like structure has an exterior side, and, when the first fan is operating, the frame-like structure conducts heat from the cooling channel to the exterior side of the frame-like structure.

15. The stationary part according to claim 13, wherein the frame-like structure includes cooling fins on the exterior side.

16. The stationary part according to claim 1, wherein the first fan is placed within the cooling channel.

17. The stationary part according to claim 1, wherein the first fan is located at the first end, or beneath the first end, of the cooling section.

18. The stationary part according to claim 1, wherein the first fan is placed within the interior of the electronic housing, wherein the electronic housing is divided by a wall into two compartments and the first fan is placed in such manner that air is transported from one of the compartments into the other compartment when the first fan is in operation.

19. The inductive power transfer pad of claim 10, wherein the cooling channel is located radially outward of the movable part.

20. The inductive power transfer pad of claim 19, wherein the movable part includes a bellows, and the cooling channel is located radially outward of the bellows, and the cooling channel runs, within the receiving section, along an outer edge of the receiving section.

* * * * *